(12) United States Patent
Park

(10) Patent No.: US 8,385,109 B2
(45) Date of Patent: Feb. 26, 2013

(54) NONVOLATILE MEMORY DEVICE AND METHOD FOR CONTROLLING THE SAME

(75) Inventor: Kyoung Wook Park, Chungeheongbuk-do (KR)

(73) Assignee: Hynix Semiconductor Inc., Icheon (KR)

( * ) Notice: Subject to any disclaimer, the term of this patent is extended or adjusted under 35 U.S.C. 154(b) by 315 days.

(21) Appl. No.: 12/823,972

(22) Filed: Jun. 25, 2010

(65) Prior Publication Data

US 2011/0261610 A1 Oct. 27, 2011

(30) Foreign Application Priority Data

Apr. 27, 2010 (KR) .................. 10-2010-0038889

(51) Int. Cl.
*G11C 11/00* (2006.01)
*G11C 7/10* (2006.01)
*G11C 7/02* (2006.01)

(52) U.S. Cl. .................. 365/163; 365/148; 365/189.06; 365/207

(58) Field of Classification Search .................. 365/148, 365/163, 189.06, 207

See application file for complete search history.

(56) References Cited

U.S. PATENT DOCUMENTS

| 6,097,638 | A * | 8/2000 | Himeno et al. ........... 365/185.25 |
| 7,177,181 | B1 * | 2/2007 | Scheuerlein ................... 365/175 |
| 7,280,391 | B2 * | 10/2007 | Kang et al. .................... 365/163 |
| 7,423,897 | B2 * | 9/2008 | Wicker .......................... 365/148 |
| 2005/0088872 | A1 * | 4/2005 | Ma ................................. 365/148 |
| 2007/0014144 | A1 * | 1/2007 | Wicker ......................... 365/148 |

FOREIGN PATENT DOCUMENTS

| KR | 1020070008216 A | 1/2007 |
| KR | 1020090016196 A | 2/2009 |

* cited by examiner

*Primary Examiner* — Ly D Pham

(57) ABSTRACT

A nonvolatile memory device includes a cell array including a plurality of phase change memory cells, a switching unit configured to select any one of the plurality of phase change memory cells, a clamping unit coupled between the switching unit and a sensing line and configured to adjust an amount of a clamping current flowing through the sensing line, a program switching unit configured to couple the switching unit to the sensing line during a program operation, a voltage driving unit configured to supply the sensing line with a write voltage corresponding to data to be written during the program operation, and supply the sensing line with a constant read voltage during a data sensing operation, and a sense amplifier configured to compare and amplify a voltage of the sensing line and a preset read reference voltage.

20 Claims, 10 Drawing Sheets

NONVOLATILE MEMORY DEVICE AND METHOD FOR CONTROLLING THE SAME

CROSS-REFERENCE TO RELATED APPLICATION

The priority based on Korean patent application No. 10-2010-0038889, filed on Apr. 27, 2010, the disclosure of which is hereby incorporated in its entirety by reference, is claimed.

BACKGROUND OF THE INVENTION

Embodiments of the present invention relates to a nonvolatile memory device and a method for controlling the same, and more specifically, to a technology capable of reducing a cell operation time in a memory device performing a program operation and a data sensing operation.

Memory devices may be classified into volatile and nonvolatile memory devices. The nonvolatile memory devices use nonvolatile memory cells which can retain stored data even when power is interrupted. Examples of the nonvolatile memory devices include flash random access memory (RAM) and phase change RAM (PRAM).

The PRAM includes memory cells that are implemented using a phase change material (PCM), e.g., germanium antimony tellurium (GST). If heat is applied to the GST, the GST changes to a crystalline phase or an amorphous phase to store data in the memory cells.

Nonvolatile memory devices such as a magnetic memory and a PRAM have a data processing speed as high as volatile RAMs, and can retain data even when power is interrupted.

FIGS. 1A and 1B are diagrams showing a conventional phase change resistor (PCR) element 4.

The PCR element 4 includes a top electrode 1, a bottom electrode 3, and a phase change material (PCM) layer 2 interposed therebetween. When a voltage and a current are applied to the PCR element 4, a high temperature is induced in the PCM layer 2 and thus an electrical conduction state of the PCM layer 2 changes depending on resistance variation.

AgInSbTe is usually used as a material for the PCM layer 2. The PCM layer 2 uses a chalcogenide which includes chalcogen elements, e.g., S, Se and Te as main components. Specifically, the PCM layer 2 uses a germanium antimony tellurium alloy ($Ge_2Sb_2Te_5$) composed of Ge—Sb—Te.

FIGS. 2A and 2B are diagrams showing a phase changing principle of the conventional PCR element 4.

As illustrated in FIG. 2A, if a low current smaller than a threshold value flows through the PCR element 4, the temperature of the PCR element 4 becomes suitable for crystallization of the PCM layer 2. Accordingly, the PCM layer 2 changes to a crystalline phase and thus goes to a low resistance state.

On the other hand, as illustrated in FIG. 2B, if a high current larger than the threshold value flows through the PCR element 4, the temperature of the PCM layer 2 rises above the melting point. Accordingly, the PCM layer 2 changes to an amorphous phase and thus goes to a high resistance state.

As such, the PCR element 4 can store data corresponding to two resistance states in a nonvolatile manner. That is, assuming that the PCM element 4 is in the low resistance state corresponds to data "1" and a case in which the PCM element 4 is in the high resistance state corresponds to data "0", two logic states of data can be stored in the PCR element 4.

FIG. 3 is a diagram showing a write operation of a conventional PCR cell.

High heat is generated when a current flows between the top electrode 1 and the bottom electrode 3 of the PCR element 4 for a predetermined time. Accordingly, the PCM layer 2 changes to the crystalline phase or the amorphous phase, depending on the temperature applied to the top electrode 1 and the bottom electrode 3.

When a low current flows for a predetermined time, the PCM layer 2 has the crystalline phase formed by a low-temperature heating state thereof, and the PCR element 4 becomes a low resistance element having a set phase. On the other hand, when a high current flows for a predetermined time, the PCM layer 2 has the amorphous phase formed by a high-temperature heating state thereof, and the PCR element 4 becomes a high resistance element having a reset phase. Therefore, the difference of the two phases is exhibited as electrical resistance variation.

Accordingly, in order to write the set phase in the write operation, a low voltage is applied to the PCR element 4 for a long time. On the other hand, in order to write the reset phase in the write operation, a high voltage is applied to the PCR element 4 for a short time.

FIG. 4 is a configuration diagram of a conventional PRAM.

The conventional PRAM includes a cell array 10, a switching unit 11, a precharge unit 12, a write driving unit 13, a clamping unit 14, a precharge unit 15, a current-to-voltage conversion unit 16, and a sense amplifier 17.

The cell array 10 includes a plurality of phase change memory cells each of which has a PCR element. Each memory cell includes a variable resistor element and an access element. The variable resistor element has a phase change material having one of two different resistances depending on a crystalline phase or an amorphous phase. The access element controls a current flowing through the variable resistor element.

A ground voltage GND or a pumping voltage VPP is applied to the cell array 10 through a word line WL.

The switching unit 11 selects a column of a phase change memory cell in the cell array 10 where data is to be written or read out.

The precharge unit 12 precharges an input/output line SIO with a peripheral voltage VPERI in response to a precharge signal PCG1 before a data sensing operation.

The write driving unit 13 controls a program operation by supplying the input/output line SIO with a write voltage corresponding to data to be written.

The clamping unit 14 clamps a voltage level of the input/output line SIO to a voltage range suitable for a read operation in response to a clamp signal CMP.

The precharge unit 15 precharges a sensing line SAI with a voltage VSA in response to a precharge signal PCG2 during the data sensing operation.

The current-to-voltage conversion unit 16 converts a current flowing through the sensing line SAI into a voltage in response to a sensing control signal SAIL. The sensing control signal SAIL corresponds to a constant current source. A bias voltage of the sensing control signal SAIL is applied with a level at which a phase of a phase change material (GST) is changed. In this case, when the GST has a set phase, a current level of the sensing line SAI is lowered.

The sense amplifier 17 is coupled to the sensing line SAI, and senses and amplifies a voltage of the sensing line SAI according to a read reference voltage VRDref.

FIG. 5 is a waveform diagram showing the program operation and the read operation on the PRAM in FIG. 4.

When a program signal PGM is applied in a write operation mode, a high voltage is applied to the PCR element for a short time in order to write the reset data. After the program operation is completed, a precharge operation is performed. Subsequently, when a read signal RD is applied, a read current is applied, and a read operation on the reset data is performed.

On the other hand, when the program signal PGM is applied in the write operation mode, a low voltage is applied to the PCR element for a long time in order to write the set data. After the program operation is completed, the precharge operation is performed. Subsequently, when the read signal RD is applied, a read current is applied and a read operation on the set data is performed.

The conventional PRAM requires different functions in order to perform the program operation and the data sensing operation.

That is, the program operation is performed through the write driving unit 13, and the precharge operation is performed through the precharge units 12 and 15. Then, the read operation is performed using the clamping unit 14, the current-to-voltage conversion unit 16, and the sense amplifier 17.

In this case, a separate circuit for performing the program operation and for performing the data sensing operation must be provided. Therefore, a cell data program time and data sensing time becomes longer, and a layout area increases.

BRIEF SUMMARY OF THE INVENTION

The embodiments of the present invention provide the following features.

First, since a PRAM requires a verification function, a data sensing period always exists after a program operation. According to embodiments of the present invention, a data sensing operation is performed immediately after a program operation, thereby reducing program and data sensing times.

Second, set data or reset data is programmed by adjusting a current flowing through a PCR element during a program operation. After the program operation, a data sensing operation is performed by generating an additional pulse for successive data sensing.

Third, since bit lines are charged at the same level before a read operation, an additional precharge time is unnecessary.

Fourth, a layout area is reduced by decreasing a precharge circuit and duplicated operation driving units.

In an embodiment of the present invention, a nonvolatile memory device includes: a cell array including a plurality of nonvolatile memory cells; a program switching unit configured to couple the cell array to the sensing line during a program operation; a voltage driving unit configured to supply the sensing line with a write voltage during the program operation, and supply the sensing line with a read voltage during a data sensing operation; and a sense amplifier configured to compare and amplify a voltage of the sensing line and a preset read reference voltage.

In another embodiment of the present invention, in a nonvolatile memory device including a cell array having a plurality of nonvolatile memory cells, a voltage driving unit configured to supply a sensing line with a write voltage during a program operation and supply the sensing line with a read voltage during a data sensing operation after performing the program operation, and a sense amplifier configured to compare and amplify a voltage of the sensing line and a preset read reference voltage, a method for controlling the nonvolatile memory device includes: writing data to the cell array according to the write voltage supplied to the sensing operation during the program operation; and performing the data sensing operation according to the read voltage applied to the sensing line without performing a precharge operation after writing the data to the cell array during the program operation.

DESCRIPTION OF EMBODIMENTS

Description will now be made in detail in reference to the embodiments of the present invention and accompanying drawings. Wherever possible, the same reference numbers will be used throughout the drawings to refer to the same or like elements.

Figure 1A:
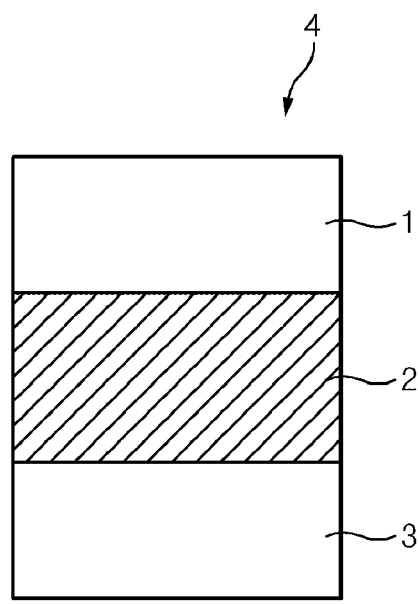
FIGS. 1A and 1B are diagrams showing a conventional PCR element.
Figure 1B:
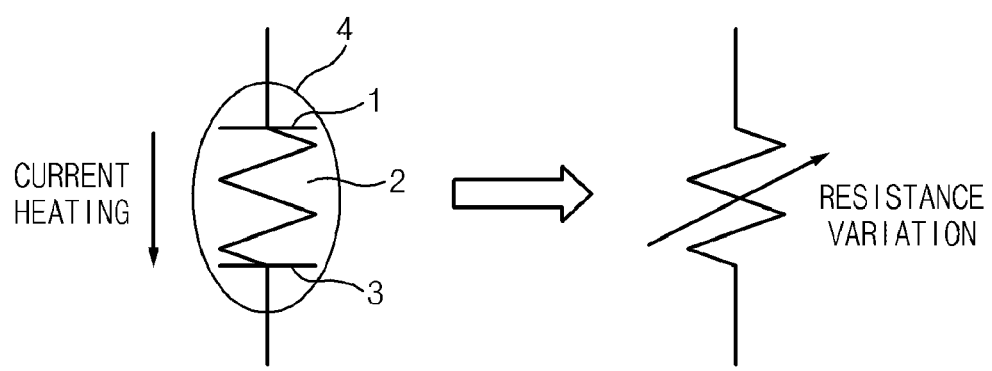
Figure 2A:
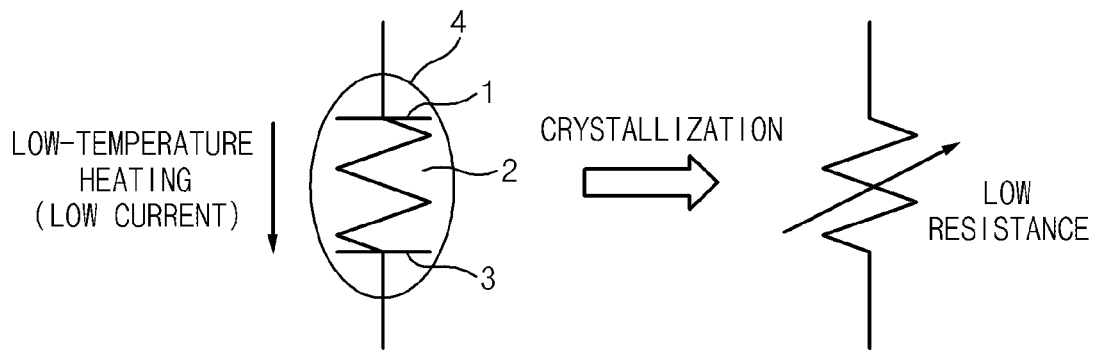
FIGS. 2A and 2B are diagrams showing a phase changing principle of the conventional PCR element.
Figure 2B:
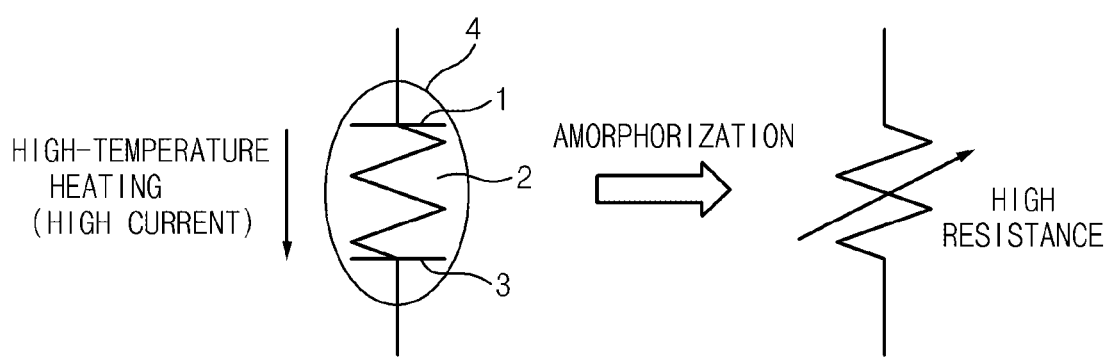
Figure 3:
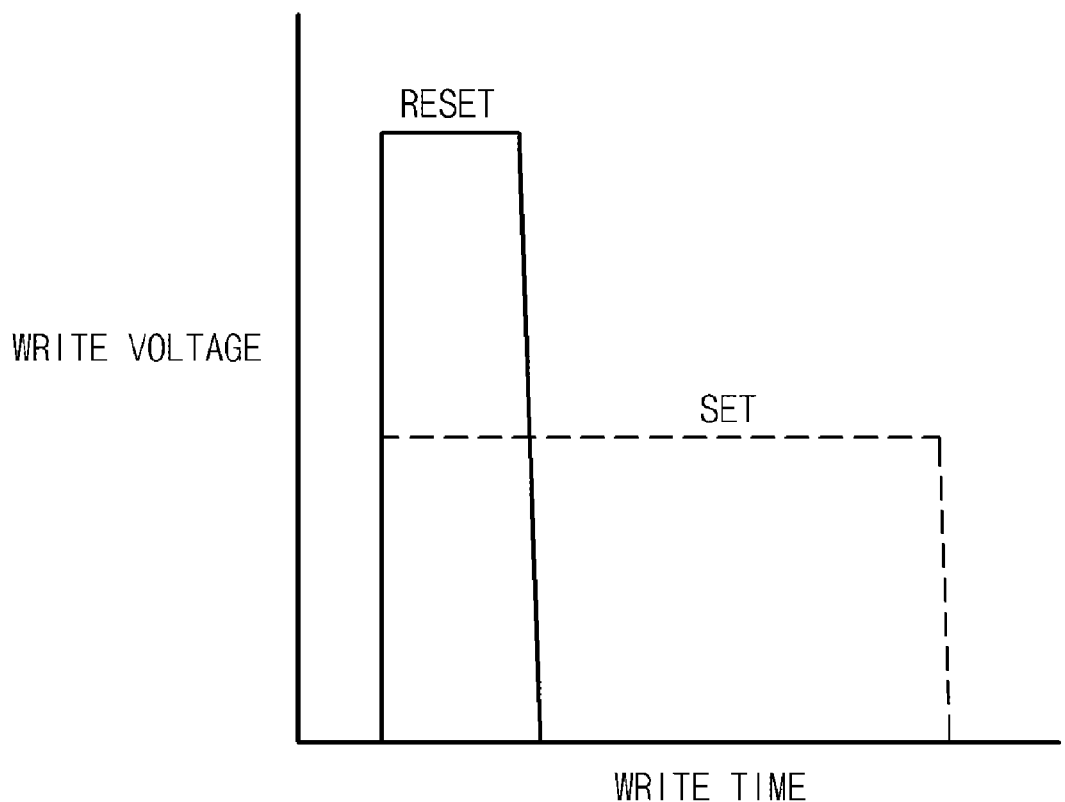
FIG. 3 is a diagram showing a write operation of a conventional PCR cell.
Figure 4:
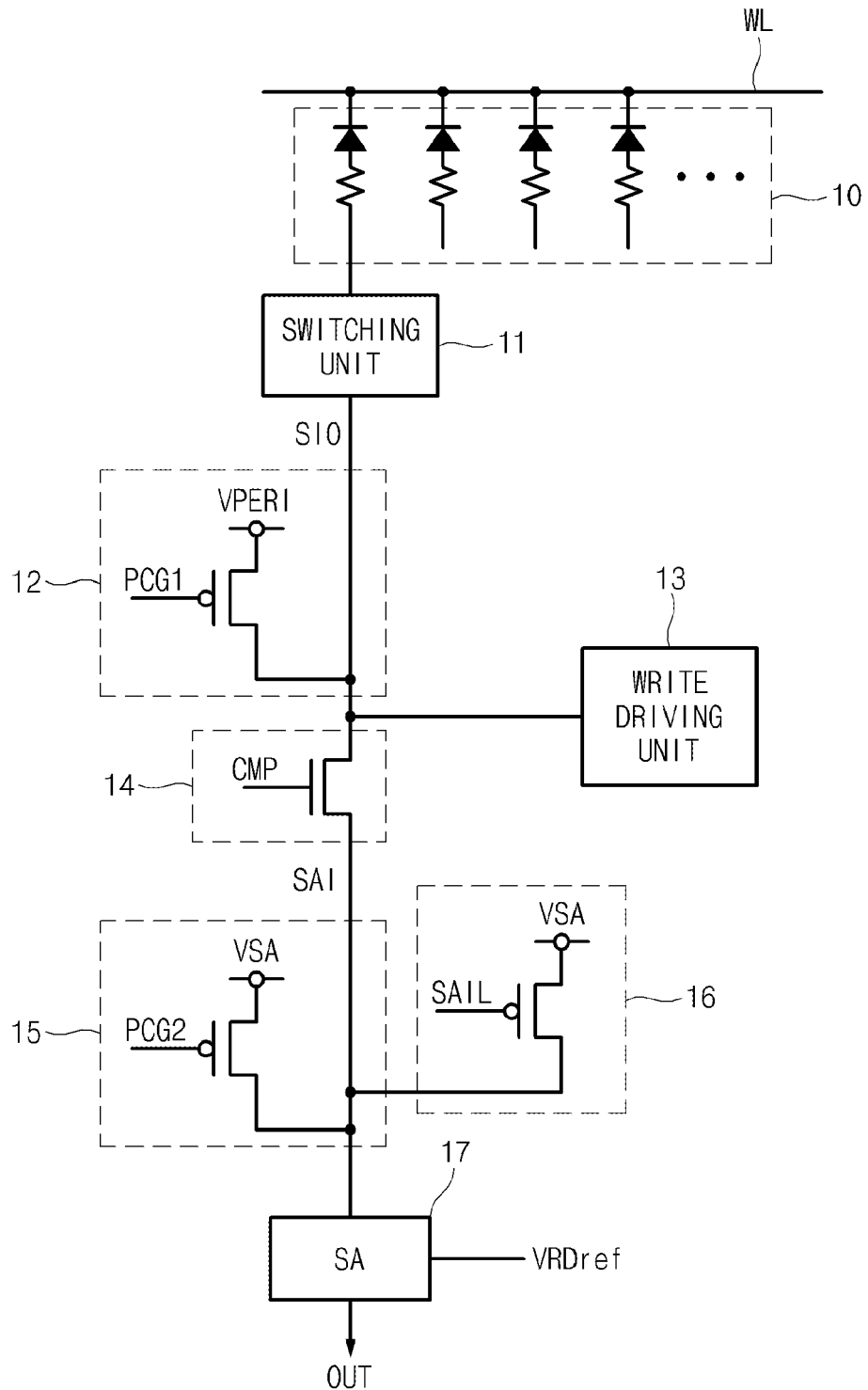
FIG. 4 is a configuration diagram of a conventional PRAM.
Figure 5:
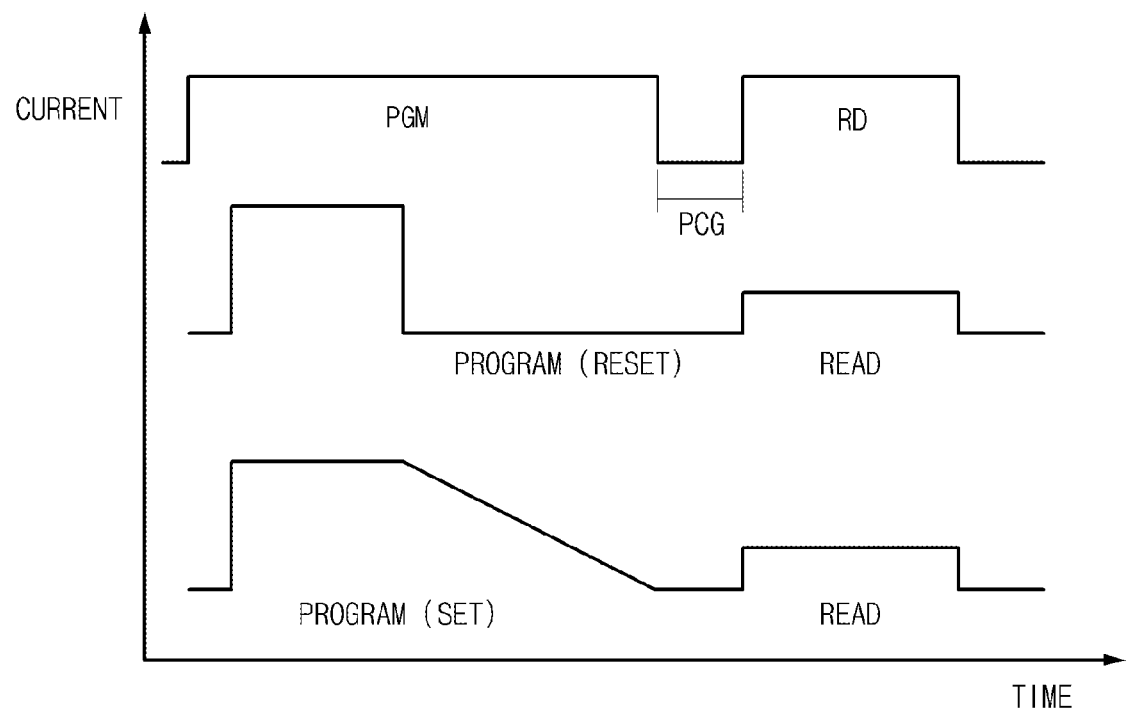
FIG. 5 is a waveform diagram showing a program operation and a read operation of the PRAM in FIG. 4.
Figure 6:
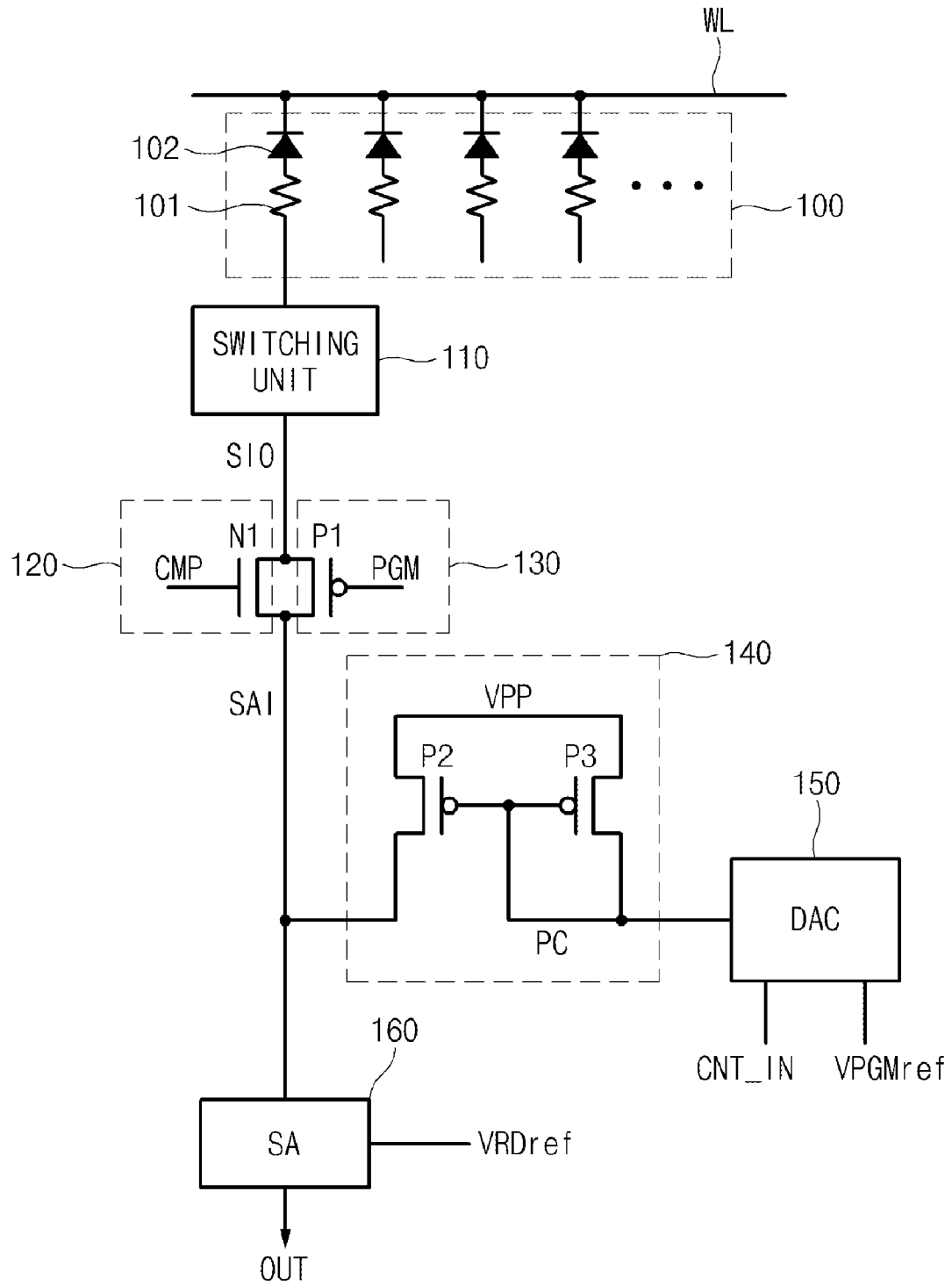
FIG. 6 is a configuration diagram of a nonvolatile memory device according to an embodiment of the present invention.

FIG. 6 is a configuration diagram of a nonvolatile memory device according to an embodiment of the present invention.

Referring to FIG. 6, the nonvolatile memory device according to an embodiment of the present invention, e.g., a PRAM, includes a cell array 100, a switching unit 110, a clamping unit 120, a program switching unit 130, a voltage controller 140, a digital-to-analog converter (DAC) 150, and a sense amplifier 160.

The cell array 100 includes a plurality of phase change memory cells each of which has a PCR element. Each cell includes a variable resistor element 101 and an access element 102. The variable resistor element 101 includes a phase change material having one of two different resistances, depending on a crystalline phase or an amorphous phase. The access element 102 controls a current flowing through the variable resistor element 101. A ground voltage GND or a pumping voltage VPP is applied to the cell array 100 through a word line WL.

The access element 102 may include a diode or a transistor coupled in series to the variable resistor element 101. The phase change material may include various kinds of materials, e.g., two-element compounds such as GaSb, InSb, InSe, $Sb_2Te_3$, and GeTe, three-element compounds such as GeSbTe, GaSeTe, InSbTe, $SnSb_2Te_4$, and InSbGe, and four-element compounds such as AgInSbTe, (GeSn)SbTe, GeSb(SeTe), and $Te_{81}Ge_{15}Sb_2S_2$. Among these materials, GeSbTe composed of germanium (Ge), antimony (Sb), and tellurium (Te) is usually used.

The switching unit 110 is coupled between a bit line of the cell array 100 and an input/output line SIO. The switching unit 110 selects a column of a phase change memory cell in the cell array 100 where data is to be written or read out.

The clamping unit 120 clamps a voltage level of the input/output line SIO to a voltage range suitable for a read operation. Specifically, a voltage level of a sensing line SAI is clamped to a predetermined level lower than a threshold voltage Vth of the phase change material. This is because, if the voltage level of the sensing line SAI is higher than the threshold voltage Vth of the phase change material, a phase of a phase change material of the selected phase change memory cell may be changed.

To this end, the clamping unit 120 includes an NMOS transistor Ni that is coupled between the input/output line SIO and the sensing line SAI, and receives a clamp signal CMP through a gate thereof. The clamp signal CMP may have a constant voltage form or a pulse form which is activated only during the read operation.

The clamping unit 120 is inactivated in a program operation mode and activated in a data sensing mode.

The program switching unit 130 includes a PMOS transistor P1 to select the program operation mode. The PMOS transistor P1 is coupled between the input/output line SIO and the sensing line SAI, and receives a program signal PGM through a gate thereof. The program switching unit 130 is activated in the program operation mode to substantially prevent a voltage drop of the input/output line SIO.

The voltage controller 140 controls a voltage supplied to the sensing line SAI in response to a voltage control signal PC. That is, the voltage controller 140 supplies the sensing line SAI with a write voltage in response to the voltage control signal PC during the program operation while supplying the sensing line SAI with a read voltage in response to the voltage control signal PC during the data sensing operation.

The voltage controller 140 includes a PMOS transistor P2 which is coupled between a terminal of the pumping voltage VPP and the sensing line SAI and receives the voltage control signal PC through a gate thereof. Also, the voltage controller 140 includes a PMOS transistor P3 which is coupled between the terminal of the pumping voltage VPP and an output node of the DAC 150 and receives the voltage control signal PC through a gate thereof. The sensing line SAI is shared by the sense amplifier 160 and the voltage controller 140.

The DAC 150 converts a digital signal into an analog signal according to a program reference voltage VPGMref and a count input CNT_IN, and outputs the analog signal to the voltage controller 140 as the voltage control signal PC. The count input CNT_IN includes information on a start time and an end time of the program operation mode.

That is, the DAC 150 generates a pulse for performing the program operation, and supplies the generated, pulse to the voltage controller 140. When the write data is reset data, the DAC 150 supplies a rectangular pulse. On the other hand, when the write data is set data, the DAC 150 supplies the rectangular pulse and then a slow quenching pulse.

In this embodiment, the configuration including the voltage controller 140 and the DAC 150 will be referred to as a "voltage driving unit". The voltage driving unit supplies the sensing line SAI with a write voltage during the program operation, and a read voltage during the data sensing operation.

The sense amplifier 160 is coupled to the sensing line SAI, and senses and amplifies the voltage of the sensing line SAI according to a read reference voltage VRDref. At this time, the read reference voltage VRDref is set to a middle level of the voltage applied to the sensing line SAI, depending on whether the phase change material (GST) is at a high level or a low level.

In this embodiment, since the precharge circuit and the current-to-voltage conversion circuit are omitted, the layout area can be reduced as compared to the conventional PRAM. Moreover, since the precharge circuit and the current-to-voltage conversion unit are unnecessary, the switching time can be reduced.

Figure 7:
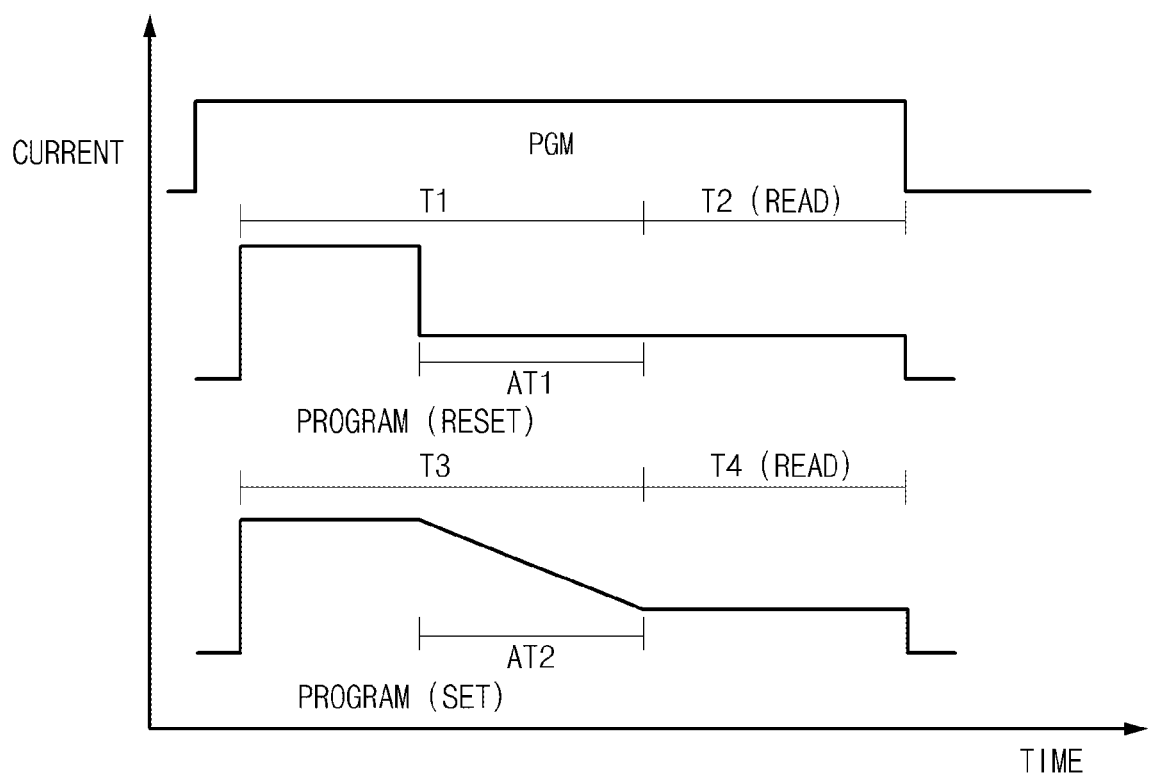
FIG. 7 is a waveform diagram showing a program operation and a read operation on the nonvolatile memory device in FIG. 6 according to an embodiment of the present invention.

FIG. 7 is a waveform diagram showing a program operation and a read operation on the nonvolatile memory device in FIG. 6 according to an embodiment of the present invention.

When the program signal PGM is activated in the write operation mode, the program switching unit 130 is turned on. In this embodiment, the program switching unit 130 is turned on when the program signal PGM has a logic low level.

When the program switching unit 130 is turned on, the input/output line SIO and the sensing line SAI are coupled together.

Accordingly, data is written to the cell array 100 according to the write voltage applied from the voltage controller 140.

The PRAM stores data by using a phase change material, such as a chalcogenide alloy, which changes to a crystalline phase or an amorphous phase when heated and then cooled. That is, since the phase change material in the crystalline phase has a low resistance, and the phase change material in the amorphous phase has a high resistance, the crystalline phase may be defined as set data or data "0", and the amorphous phase may be defined as reset data or data "1".

The read operation of the PRAM will be described below. First, a phase change memory cell where the read operation is to be performed is selected among a plurality of phase change memory cells. When a read current is applied to the selected phase change memory cell, a pass current dependent on the resistance of the phase change material is generated. The sense amplifier 160 detects data "0" or data "1" by comparing the voltage level of the sensing line SAI, which is changed by the pass current, with the voltage level of the read reference voltage VRDref.

For example, in order to write the reset phase to the cell array 100, a high voltage is applied to the PCR element for a short time, and then the PCR element maintains the read voltage level in a program period T1. When the program operation is completed, a read current is immediately applied, and the read operation of the reset data is performed during a read period T2.

At this time, an end time of the program operation can be known from a state of the count input CNT_IN since the read operation starts by activating the sense amplifier 160 at an end time of the count input CNT_IN.

In this embodiment, when the program operation is completed, the sense amplifier 160 is operated without performing a precharge operation, so that the read operation is performed successively. At this time, when the program operation is completed, a constant read current (i.e., substantially constant) is supplied to the sensing line SAI by adjusting a level of the voltage control signal PC supplied to the voltage controller 140. In this case, the sensing line SAI has a current level corresponding to the cell data, i.e., the reset data.

On the other hand, in order to write the set phase to the cell array 100, a low voltage is applied to the PCR element for a long time in a program period T3. When the program operation is completed, a read current is immediately applied and a read operation on the set data is performed during a read period T4.

At this time, the end time of the program operation can be known from the state of the count input CNT_IN. That is, the read operation is performed by activating the sense amplifier 160 at the end time of the count input CNT_IN.

In this embodiment, when the program operation is completed, the sense amplifier 160 operates without performing the precharge operation, so that the read operation is performed successively. At this time, when the program operation is completed, a constant current is supplied to the sensing line SAI by adjusting the level of the voltage control signal PC supplied to the voltage controller 140. In this case, the sensing line SAI has a current level corresponding to the cell data, i.e., the set data.

Since the PRAM according to an embodiment of the present invention requires a verification function, the data sensing period should exist after the program operation. Accordingly, the data sensing operation is performed immediately after the program operation, thereby reducing the program and data sensing time.

In addition, the set data or the reset data is programmed to the cell array 100 by adjusting the current flowing through the PCR element during the program operation. After the program operation, the sensing operation is performed by generating an additional pulse for the successive data sensing.

Furthermore, since the bit lines are charged with the same level before the read operation, an additional precharge time is unnecessary.

That is, before the read operation on the reset data (i.e., before the start of the period T2), the current level is reduced during a specific program period AT1 so that the bit lines are charged with the same level as the read current level. Also, before the read operation on the set data (i.e., before the start of the period T4), the current level is gradually reduced during a specific program period AT2 so that the bit lines are charged with the same level as the read current level.

Accordingly, after the program operation, the data sensing operation can be successively performed without performing the precharge operation.

At this time, the current having the same level as the read current level is applied to the cell array 100 during the specific program periods AT1 and AT2. When the clamping unit 120 is turned on, a small current flows through the cell array 100. In this manner, only the data sensing using the read current is allowed without changing the phase change material of the cell array 100.

The program voltage and the read voltage outputted to the sensing line SAI can be adjusted to a desired level by controlling the level of the voltage control signal PC supplied to the voltage controller 140.

Figure 8:
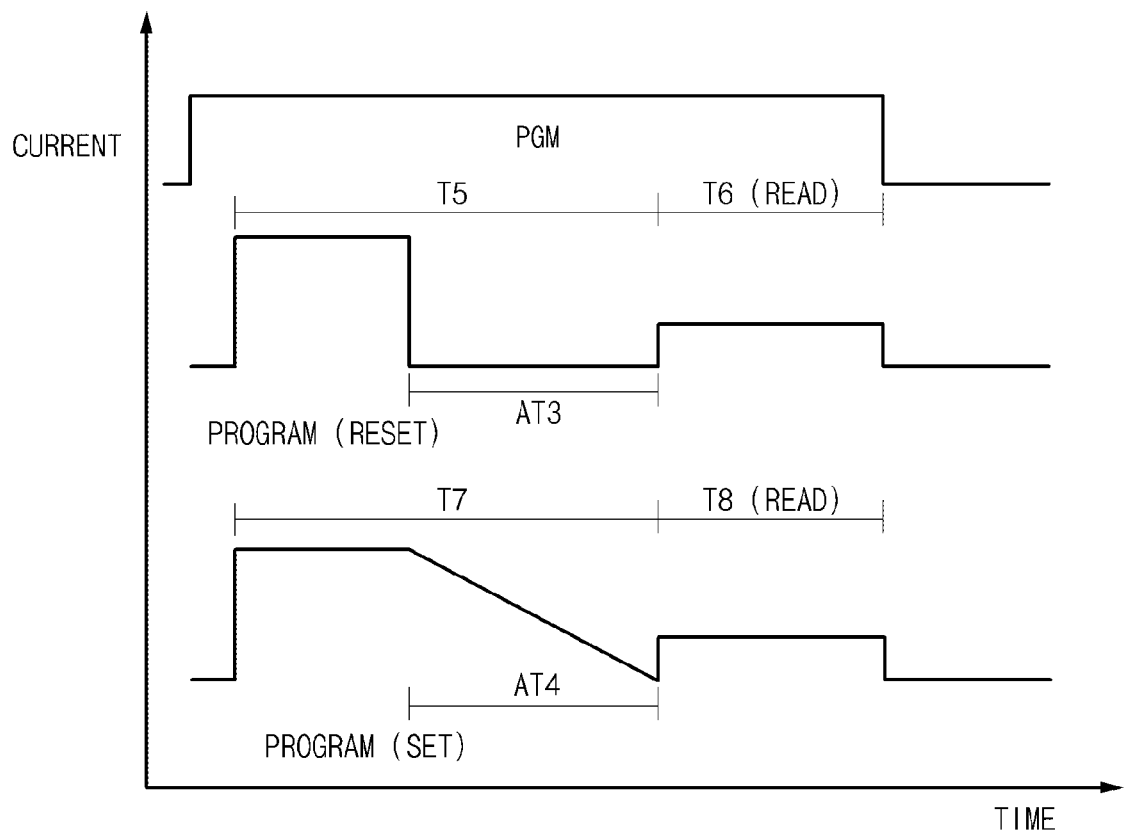
FIG. 8 is a waveform diagram showing a program operation and a read operation on the nonvolatile memory device in FIG. 6 according to another embodiment of the present invention.

FIG. 8 is a diagram showing a program operation and a read operation on the nonvolatile memory device in FIG. 6 according to another embodiment of the present invention.

When the program signal PGM is activated in the write operation mode, the program switching unit 130 is turned on. In this embodiment, the program switching unit 130 is turned on when the program signal PGM has a logic low level.

When the program switching unit 130 is turned on, the input/output line SIO and the sensing line SAI are coupled together.

Accordingly, data is written to the cell array 100 according to the write voltage applied from the voltage controller 140.

For example, in order to write the reset phase to the cell array 100, a high voltage is applied to the PCR element for a short time, and then the PCR element maintains the ground voltage level during a program period T5. When the program operation is completed, a read current is immediately applied and the read operation on the reset data is performed during a read period T6. At this time, the end time of the program operation can be known from the state of the count input CNT_IN.

In this embodiment, when the program operation is completed, the sense amplifier 160 operates without performing the precharge operation, so that the read operation is successively performed. At this time, when the program operation is completed, a constant current is supplied to the sensing line SAI by adjusting the level of the voltage control signal PC supplied to the voltage controller 140. In this case, the sensing line SAI has a current level corresponding to the cell data, i.e., the reset data.

On the other hand, in order to write the set phase to the cell array 100, a low voltage is applied to the PCR element for a long time in a program period T7. When the program operation is completed, a read current is immediately applied, and the read operation on the set data is performed during a read period T8. At this time, the end time of the program operation can be known from the state of the count input CNT_IN.

In this embodiment, when the program operation is completed, the sense amplifier 160 operates without performing the precharge operation, so that the read operation is successively performed. At this time, when the program operation is completed, a constant current is supplied to the sensing line SAI by adjusting the level of the voltage control signal PC supplied to the voltage controller 140. In this case, the sensing line SAI has a current level corresponding to the cell data, i.e., the set data.

Before the read operation on the reset data (i.e., before the start of the period T6), the current level is reduced during a specific program period AT3 and maintains the ground voltage level. Also, before the operation of reading the set data (i.e., before the start of the period T8), the current level is gradually reduced during a specific program period AT4 and finally becomes the ground voltage level.

Figure 9:
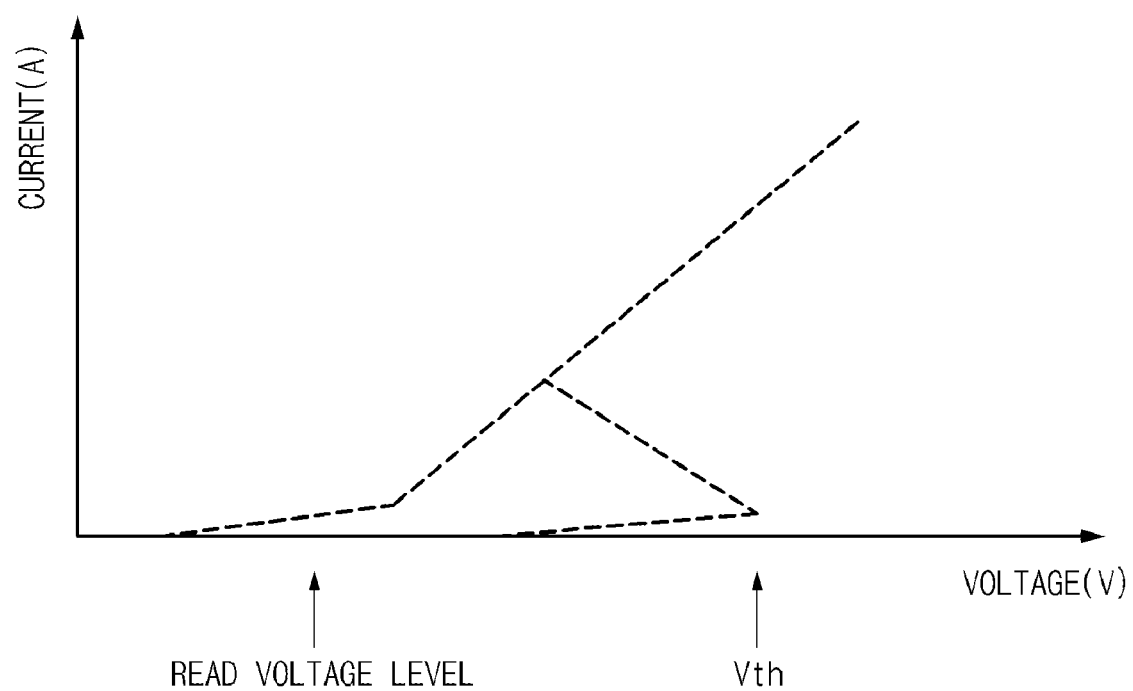
FIG. 9 is a graph showing the current-voltage variation of a phase change material in the nonvolatile memory device according to an embodiment of the present invention.

FIG. 9 is a graph showing the current-voltage variation of the phase change material in the nonvolatile memory device according to an embodiment of the present invention.

When the voltage supplied from the voltage controller 140 has a read voltage level, the current is so small as to discriminate data "1" and data "0". When the voltage supplied from the voltage controller 140 is higher than the threshold voltage Vth, the current rapidly increases.

Figure 10:
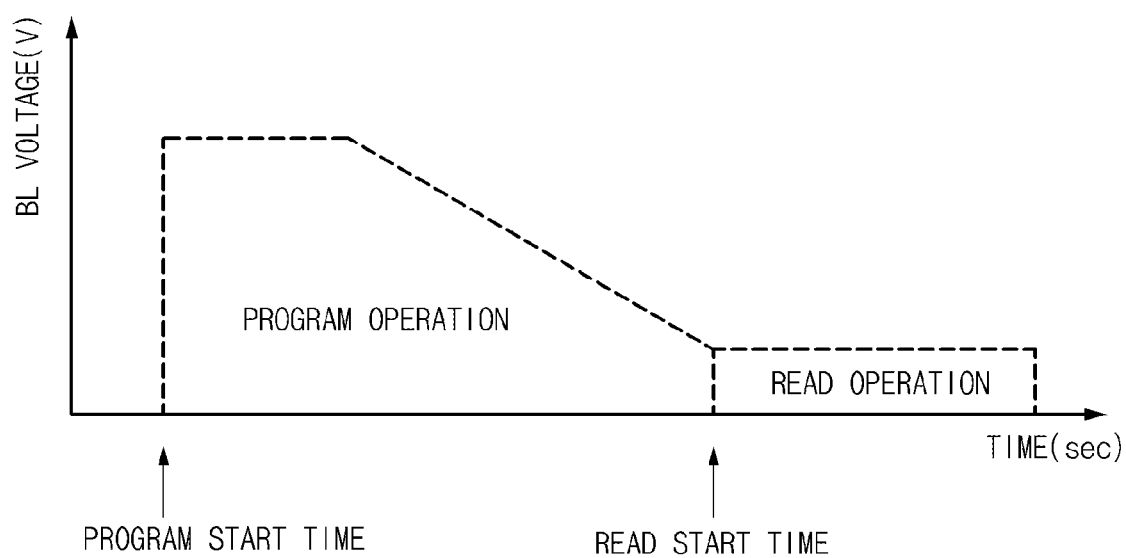
FIG. 10 is a graph showing variation of a voltage applied to a bit line over time in the nonvolatile memory device according to an embodiment of the present invention.

FIG. 10 is a graph showing a pulse in which a voltage applied to a bit line BL varies over time.

When the program operation starts, the program signal PGM is activated and the write voltage having a high voltage level is supplied to the bit line BL coupled to the cell array 100. Then, the voltage of the bit line BL gradually decreases during the program operation.

Subsequently, when the program operation is completed, the sense amplifier 160 operates, and the read operation is successively performed. During the read operation, the read voltage having a low voltage level is applied to the bit line BL.

The nonvolatile memory device according to an embodiment of the present invention can be applied to any type of memory devices which use a resistor element and have the same program and data sensing mechanism.

When the program and data sensing operations are performed in the same manner as in the PRAM, the program operation and the data sensing operation can be successively performed. In particular, when the cell operation is slow or the verification operation is required, the voltage sources can be unified. Moreover, the program and sensing speed can be improved, and the layout area can be reduced.

The embodiments of the present invention have the following effects.

First, the program and data sensing time can be reduced because the data sensing operation is performed immediately after the program operation.

Second, the set or reset operation is performed by adjusting the current flowing through the PCR element during the program operation, and the additional pulse is generated in order for the successive data sensing operations after the program operation, thereby reducing the cell operation time.

Third, since the bit lines are charged with the same level before the read operation, an additional precharge time is unnecessary, thereby reducing the current consumption.

Fourth, since the precharge circuit and the duplicated operation driving units are reduced, the voltage sources can be unified, the circuit can be simplified, and the layout area can be reduced.

Although the use of the PRAM has been described above as the embodiments of the present invention, it is apparent to those skilled in the art that the embodiments of the present invention can also be applied to any type of nonvolatile memory device using a resistor, such as a resistive RAM (ReRAM), a ferroelectric RAM (FeRAM), and a magnetic RAM (MRAM).

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A nonvolatile memory device comprising:
a cell array including a plurality of nonvolatile memory cells;
a program switching unit configured to couple an input/output line of the cell array to a sensing line during a program operation, wherein the program switching unit is activated in the program operation to prevent a voltage drop of the input/output line;
a voltage driving unit configured to supply the sensing line with a write voltage during the program operation, and supply the sensing line with a read voltage during a data sensing operation; and
a sense amplifier configured to amplify a difference between a voltage of the sensing line and a preset read reference voltage.

2. The nonvolatile memory device according to claim 1, wherein the data sensing operation is performed after the program operation without performing a precharge operation,
wherein the program switching unit is configured to couple the input/output line of the cell array and the sensing line during the program operation via a switching unit, the switching unit being configured to select any one of the plurality of memory cells in the cell array.

3. The nonvolatile memory device according to claim 1, further comprising a clamping unit configured to adjust an amount of a clamping current flowing through the sensing line.

4. The nonvolatile memory device according to claim 3, wherein the clamping unit is controlled by a clamp signal and activated during the data sensing operation.

5. The nonvolatile memory device according to claim 1, wherein the program switching unit comprises a transistor that is controlled by a program signal, the transistor being configured to be turned on during the program operation.

6. The nonvolatile memory device according to claim 1, wherein the voltage driving unit comprises:
a digital-to-analog converter configured to supply a pulse for performing the program operation or the data sensing operation; and
a voltage controller configured to supply the sensing line with the write voltage during the program operation, and supply the sensing line with the read voltage during the data sensing operation, depending on the pulse supplied from the digital-to-analog converter.

7. The nonvolatile memory device according to claim 6, wherein the digital-to-analog converter controls a voltage level of the pulse according to a preset program reference voltage and a count input.

8. The nonvolatile memory device according to claim 7, wherein the count input includes information on a start time and an end time of the program operation.

9. The nonvolatile memory device according to claim 1, wherein the program switching unit is activated during an activation period of a program signal, and the data sensing operation is performed after the program operation.

10. The nonvolatile memory device according to claim 1, wherein the voltage driving unit supplies the sensing line with a write voltage corresponding to reset data during an operation of programming the reset data, and subsequently supplies the sensing line with a voltage having a level substantially equal to a level of the read voltage.

11. The nonvolatile memory device according to claim 1, wherein the voltage driving unit supplies the sensing line with a write voltage corresponding to set data during an operation of programming the set data, and subsequently decreases the write voltage to a level of the read voltage.

12. The nonvolatile memory device according to claim 1, wherein the voltage driving unit supplies the sensing line with a write voltage corresponding reset data during an operation of programming the reset data, and subsequently supplies the sensing line with a ground voltage.

13. The nonvolatile memory device according to claim 1, wherein the voltage driving unit supplies the sensing line with a write voltage corresponding to set data during an operation of programming the set data, and subsequently decreases the write voltage to a ground voltage level.

14. The nonvolatile memory device according to claim 1, wherein the memory cells are phase change memory cells.

15. A method for controlling a nonvolatile memory device including a cell array having a plurality of nonvolatile memory cells, a voltage driving unit configured to supply a sensing line with a write voltage during a program operation and supply the sensing line with a read voltage during a data sensing operation after performing the program operation, and a sense amplifier configured to amplify a difference between a voltage of the sensing line and a preset read reference voltage, the method comprising:
writing data to the cell array according to the write voltage supplied to the sensing line during the program operation;
preventing a voltage drop of an input/output line of the cell array in a period between the program operation and the data sensing operation by coupling the input/output line of the cell array to the sensing line in the program operation; and
performing the data sensing operation according to the read voltage supplied to the sensing line without performing a precharge operation after writing the data to the cell array during the program operation.

16. The method according to claim 15, wherein the writing of the data comprises:
- applying a write voltage corresponding to reset data to the sensing line; and
- applying to the sensing line a voltage having a level substantially equal to a level of the read voltage.

17. The method according to claim 15, wherein the writing of the data comprises:
- applying a write voltage corresponding to set data to the sensing line to write the set data; and
- decreasing the write voltage to a level of the read voltage after writing the set data.

18. The method according to claim 15, wherein the writing of the data comprises:
- applying the sensing line with a write voltage corresponding to reset data to write the reset data; and
- applying the sensing line with a ground voltage after writing the reset data.

19. The method according to claim 15, wherein the writing of the data comprises:
- applying the sensing line with a write voltage corresponding to set data to write the set data; and
- decreasing the write voltage to a ground voltage level after writing the set data.

20. The method according to claim 15, wherein the memory cell comprises a phase change memory cell.

* * * * *